United States Patent
Imai et al.

(10) Patent No.: US 7,166,529 B2
(45) Date of Patent: Jan. 23, 2007

(54) METHOD OF CONNECTING WIRING MEMBER

(75) Inventors: Koji Imai, Inuyama (JP); Yuji Shinkai, Handa (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 108 days.

(21) Appl. No.: 11/114,977

(22) Filed: Apr. 26, 2005

(65) Prior Publication Data

US 2005/0239229 A1    Oct. 27, 2005

(30) Foreign Application Priority Data

Apr. 27, 2004  (JP)  .............................. 2004-130703

(51) Int. Cl.
*H01L 21/44* (2006.01)

(52) U.S. Cl. ...................................... 438/612; 438/617

(58) Field of Classification Search ................ 438/612, 438/613, 614, 615, 617; 257/738, 772, 780, 257/785

See application file for complete search history.

(56) References Cited

U.S. PATENT DOCUMENTS 6,142,609 A * 11/2000 Aoki ............................ 347/50
6,328,423 B1 * 12/2001 Wong et al. ................... 347/50
6,379,745 B1 * 4/2002 Kydd et al. .................. 438/610
7,055,936 B2 * 6/2006 Imai et al. ..................... 347/58
7,059,512 B2 * 6/2006 Arita et al. .................. 438/613
7,078,330 B2 * 7/2006 Maeda et al. ............... 438/612
2002/0117330 A1 * 8/2002 Eldridge et al. ............ 438/617
2003/0112298 A1    6/2003 Sato et al.

FOREIGN PATENT DOCUMENTS

JP    A-2003-69103    3/2003

* cited by examiner

*Primary Examiner*—Kevin M. Picardat
(74) *Attorney, Agent, or Firm*—Reed Smith LLP (57) ABSTRACT

A method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method including: forming convex bumps by using a conductive solder, respectively on the plurality of terminal portions; and connecting the plurality of terminal portions and the plurality of electrodes respectively to one another via the respective convex bumps by heating and melting the convex bumps at a predetermined temperature with the convex bumps pressed respectively onto the plurality of electrodes with a predetermined load, wherein the connecting the plurality of terminal portions and the plurality of electrodes is carried out such that the predetermined load and the predetermined temperature are decreased with an increase in a height of the convex bumps.

28 Claims, 8 Drawing Sheets

METHOD OF CONNECTING WIRING MEMBER

The present application is based on Japanese Patent Application No. 2004-130703 filed on Apr. 27, 2004, the contents of which are incorporated herein by reference.

BACKGROUND OF THE INVENTION

1. Field of the Invention

The present invention relates in general to a method of electrically connecting a wiring member to a plurality of electrodes which respectively correspond to a plurality of recording elements of a recording head.

2. Discussion of Related Art

A recording head of a recording head unit generally includes an actuator unit having a plurality of individual electrodes which are provided to correspond respectively to a plurality of recording elements. The actuator unit is arranged such that, when an operating signal is supplied to selected one or ones of the plurality of individual electrodes, one or ones of the plurality of recording elements corresponding to the selected one or ones of the individual electrodes is/are operated to perform recording of suitable images, characters, etc., on a recording medium. As one example of such an actuator unit, a piezoelectric actuator is disclosed in U.S. Patent Application Publication No. 2003/0112298 A1 corresponding to JP-A-2003-69103 (FIGS. 2 and 3, in particular), for instance. The piezoelectric actuator includes a plurality of tabular piezoelectric elements and a plurality of electrodes (signal electrodes) which respectively correspond to the plurality of piezoelectric elements.

To the plurality of electrodes of such a piezoelectric actuator, there is connected, in the following manner, a wiring member such as a flexible printed wiring board which includes a plurality of conductive leads each having a wire portion and a terminal portion and on which is formed a predetermined wiring pattern constituted by the conductive leads. (Because the flexible printed wiring board may be referred to as a flexible printed circuit, the flexible printed wiring board may be referred to as "FPC" in the following description.) Namely, a convex conductive bump is initially formed on a surface of each terminal portion by using a conductive solder as a bonding agent (e.g., Sn—Pb alloy). Then, the terminal portions of the wiring member and the electrodes are respectively bonded to one another via the respective conductive bumps by heating and melting the bumps with the bumps being pressed onto the respective electrodes with a predetermined load.

SUMMARY OF THE INVENTION

Conventionally, the bumps are pressed onto the respective electrodes by utilizing a self-weight of the wiring member, for instance, and, in many instances, there have/has not been strictly specified a load to be applied to the bumps when the bumps are pressed onto the electrodes and/or a temperature at which the bumps are heated. The height of bumps which are formed on one wiring member may differ from that of bumps which are formed on another wiring member, due to various factors in a bump-forming step such as a difference in the temperature to be employed for heating the bonding agent and a degree of accuracy of the operation of an apparatus to be used. Where the bumps and the electrodes are bonded always under constant conditions in which the load to be applied to the bumps when the bumps are pressed onto the electrodes and the heating temperature of the bumps are kept at respectively constant levels, in spite of differences in the height of the bumps among mutually different wiring members, the amount of the conductive solder which flows on the electrodes may be excessively large or, on the contrary, excessively small, causing various risks. For instance, the bonding strength between the terminal portions of the wiring member and the electrodes may be deteriorated. Further, the reliability in electrical connection between the terminal portions and the electrodes may be lowered since an electrical short or a failure in connection is likely to occur. Here, the height of the bumps may be considered as an amount of the conductive solder to be provided on the terminal portion to give each bump.

It is therefore an object of the invention to improve reliability in electrical connection between a wire member and electrodes by setting a load and a temperature in pressing the bumps onto the electrodes and melting the bumps, at respective suitable values depending upon a height of the bumps.

The above-indicated object of the present invention may be achieved according to a first aspect of the invention, which provides a method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method comprising: forming convex bumps by using a conductive solder, respectively on the plurality of terminal portions; and connecting the plurality of terminal portions and the plurality of electrodes respectively to one another via the respective convex bumps by heating and melting the convex bumps at a predetermined temperature with the convex bumps pressed respectively onto the plurality of electrodes with a predetermined load, wherein the connecting the plurality of terminal portions and the plurality of electrodes is carried out such that the predetermined load and the predetermined temperature are decreased with an increase in a height of the convex bumps.

In the method according to the above-indicated first aspect of the invention, the convex bumps are initially formed respectively on the terminal portions by using a conductive solder. (This step of forming the convex bumps may be hereinafter referred to as "first step" for the sake of convenience.) Then, the terminal portions and the electrodes are electrically connected respectively to one another via the respective convex bumps by heating and melting the bumps with the bumps pressed respectively onto the electrodes with a predetermined load. (This step of connecting the terminal portions and the electrodes to one another may be hereinafter referred to as "second step" for the sake of convenience.)

In the second step of the method according to the above-described first aspect of the invention, the load (F) and the temperature (T) are decreased with an increase in a height of the convex bumps. Accordingly, even where the height of convex bumps formed on one wiring member in the first step varies from that of convex bumps formed on another wiring member in the first step, it is possible to prevent the flow amount of the conductive solder which gives the bumps from becoming excessively small by increasing the load and the temperature where the height of the bumps is small, while, at the same time, it is possible to prevent the conductive solder from flowing to an excessive extent by decreasing the load and the temperature where the height of the bumps is large. Therefore, the present method according to the first aspect of the invention enables a suitable amount of the conductive solder as the bonding agent to be melted on the electrodes, by determining the load and the temperature to be respective suitable values depending upon the height of the bumps, thereby increasing the bonding strength between the terminal portions and the electrodes and improving the reliability in the electrical connection therebetween. It is noted that the load (F) and the temperature (T) may be changed continuously with respect to the height of the bumps or may be changed in steps for the plurality of height ranges.

In the present specification, various values can be employed as "height of bumps" because it may be considered that the height of each of the plurality of bumps formed on one FPC does not vary so largely. For instance, it is possible to employ a suitable height value in a range defined by a largest value and a smallest value such as: an average value of the height of the plurality of bumps; a median value of the height of the plurality of bumps; an average value of the largest value and the smallest value; and a value which belongs to one of a plurality of groups that are classified depending upon the height of the bumps, which one group including a largest number of the bumps.

The above-indicated object of the present invention may also be achieved according to a second aspect of the invention, which provides a method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method comprising: forming convex bumps by using a conductive solder, respectively on the plurality of terminal portions; and connecting the plurality of terminal portions and the plurality of electrodes respectively to one another via the respective convex bumps by heating and melting the convex bumps at a predetermined temperature with the convex bumps pressed respectively onto the plurality of electrodes with a predetermined load, wherein the connecting the plurality of terminal portions and the plurality of electrodes is carried out such that the predetermined load and the predetermined temperature are decreased with an increase in a level of a height range to which a height of the convex bumps belongs, the height range being one of a plurality of divided height ranges.

In the method according to the above-indicated second aspect of the invention, the convex bumps are initially formed respectively on the terminal portions by using a conductive solder. (This step of forming the convex bumps may be hereinafter referred to as "first step" for the sake of convenience.) Then, the terminal portions and the electrodes are electrically connected respectively to one another via the respective convex bumps by heating and melting the bumps with the bumps pressed respectively onto the electrodes with a predetermined load. (This step of connecting the terminal portions and the electrodes to one another may be hereinafter referred to as "second step" for the sake of convenience.)

In the second step of the method according to the above-described second aspect of the invention, the load (F) and the temperature (T) are decreased with an increase in a level of a height range to which a height of the convex bumps belongs, the height range being one of a plurality of divided height ranges. According to the method of the second aspect of the invention, it is possible to prevent the flow amount of the conductive solder which gives the bumps from becoming excessively small by increasing the load and the temperature where the height of the bumps is small, while, at the same time, it is possible to prevent the conductive solder from flowing to an excessive extent by decreasing the load and the temperature where the height of the bumps is large. Therefore, the present method according to the second aspect of the invention enables a suitable amount of the conductive solder as the bonding agent to be melted on the electrodes, by determining the load and the temperature to be respective suitable values depending upon the height of the bumps, thereby increasing the bonding strength between the terminal portions and the electrodes and improving the reliability in the electrical connection therebetween.

The above-indicated object of the present invention may also be achieved according to a third aspect of the invention, which provides a method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method comprising: forming convex bumps by using a conductive solder, respectively on the plurality of terminal portions; and connecting the plurality of terminal portions and the plurality of electrodes -respectively to one another via the respective convex bumps by heating and melting the convex bumps at a predetermined temperature with the convex bumps pressed respectively onto the plurality of electrodes with a predetermined load, wherein the connecting the plurality of terminal portions and the plurality of electrodes is carried out such that one of the predetermined load and the predetermined temperature is decreased with an increase in a level of a height range to which a height of the convex bumps belongs, the height range being one of a plurality of divided height ranges.

While both of the load (F) and the temperature (T) are decreased with an increase in the level of the height range to which the height of the convex bumps belongs in the second step of the method according to the above-described second aspect of the invention, one of the load (F) and the temperature (T) may be decreased in the second step as described in the method according to the third aspect of the invention.

FORMS OF THE INVENTION

The present invention may be practiced in various forms. Each of the various forms will be explained, together with the effect based on each form.

In one form of the method according to the above-indicated second aspect of the invention, both of the load (F) and the temperature (T) are determined to fall within respective suitable ranges depending upon the height range to which the height of the bumps belongs, as explained below.

Where the height of the convex bumps belongs to a height range of 30–50 μm, the predetermined load (F) is preferably determined such that a load to be applied to one of the convex bumps is held within a range of 3–5 mN and the predetermined temperature (T) is preferably determined to be held within a range of 265–285° C. More preferably, the predetermined load (F) is determined such that the load to be applied to one of the convex bumps is 4 mN and the predetermined temperature (F) is determined to be 275° C.

Where the height of the convex bumps belongs to a height range of 50–70 μm, the predetermined load (F) is preferably determined such that a load to be applied to one of the convex bumps is held within a range of 2–4 mN and the predetermined temperature (T) is preferably determined to be held within a range of 260–280° C. More preferably, the predetermined load (F) is determined such that the load to be applied to one of the convex bumps is 3 mN and the predetermined temperature (T) is determined to be 270° C.

Where the height of the convex bumps belongs to a height range of 70–100 μm, the predetermined load (F) is preferably determined such that a load to be applied to one of the convex bumps is held within a range of 1–3 mN and the predetermined temperature (T) is preferably determined to be held within a range of 255–275° C. More preferably, the predetermined load (F) is determined such that the load to be applied to one of the convex bumps is 2 mN and the predetermined temperature (T) is determined to be 265° C.

In one form of the method according to the above-indicated third aspect of the invention, only the temperature (T) may be determined to be held within a suitable range depending upon the height range to which the height of the convex bumps belongs while the load (F) is constantly held within a prescribed range irrespective of the height of the convex bumps, as described below.

Where the predetermined load (F) is determined such that a load to be applied to one of the convex bumps is constantly held within a range of 2–4 mN irrespective of the height of the convex bumps, the predetermined temperature (T) is preferably determined to be held within a range of 275–295° C. in a case where the height of the convex bumps belongs to a height range of 30–50 μm. More preferably, the predetermined load (F) is determined such that the load to be applied to one of the convex bumps is 3 mN and the predetermined temperature (T) is determined to be 285° C.

Where the predetermined load (F) is determined such that a load to be applied to one of the convex bumps is constantly held within a range of 2–4 mN irrespective of the height of the convex bumps, the predetermined temperature (T) is preferably determined to be held within a range of 260–280° C. in a case where the height of the convex bumps belongs to a height range of 50–70 μm. More preferably, the predetermined load (F) is determined such that the load to be applied to one of the convex bumps is 3 mN and the predetermined temperature (T) is determined to be 270° C.

Where the predetermined load (F) is determined such that a load to be applied to one of the convex bumps is constantly held within a range of 2–4 mN irrespective of the height of the convex bumps, the predetermined temperature (T) is preferably determined to be held within a range of 245–265° C. in a case where the height of the convex bumps belongs to a height range of 70–100 μm. More preferably, the predetermined load (F) is determined such that the load to be applied to one of the convex bumps is 3 mN and the predetermined temperature (T) is determined to be 255° C.

In one form of the method according to the above-indicated third aspect of the invention, only the load (F) may be determined to be held within a suitable range depending upon the height range to which the height of the convex bumps belongs while the temperature (T) is constantly held within a prescribed range irrespective of the height of the convex bumps, as described below.

Where the predetermined temperature (T) is determined to be constantly held within a range of 260–280° C. irrespective of the height of the convex bumps, the predetermined load (F) is preferably determined such that a load to be applied to one of the convex bumps is held within a range of 4–6 mN in a case where the height of the convex bumps belongs to a height range of 30–50 μm. More preferably, the predetermined temperature (T) is determined to be 270° C. and the predetermined load (F) is determined such that the load to be applied to one of the convex bumps is 5 mN.

Where the predetermined temperature (T) is determined to be constantly held within a range of 260–280° C. irrespective of the height of the convex bumps, the predetermined load (F) is preferably determined such that a load to be applied to one of the convex bumps is held within a range of 2–4 mN in a case where the height of the convex bumps belongs to a height range of 50–70 μm. More preferably, the predetermined temperature (T) is determined to be 270° C. and the predetermined load (F) is determined such that the load to be applied to one of the convex bumps is 3 mN.

Where the predetermined temperature (T) is determined to be constantly held within a range of 260–280° C. irrespective of the height of the convex bumps, the predetermined load (F) is preferably determined such that a load to be applied to one of the convex bumps is held within a range of 0.5–2 mN in a case where the height of the convex bumps belongs to a height range of 70–100 μm. More preferably, the predetermined temperature (T) is determined to be 270° C. and the predetermined load (F) is determined such that the load to be applied to one of the convex bumps is 1 mN.

In one form of the methods according to the above-indicated first through third aspects of the invention, the wiring member has flexibility. In some conventional methods of connecting a wiring member, bumps are pressed onto electrodes by utilizing a self-weight of the wiring member where the wiring member is a printed wiring board without flexibility, for instance. Where the wiring member is one such as FPC having flexibility, however, it may be difficult to uniformly press the bumps onto the electrodes by the self-weight of the wiring member. In view of this, it is required that the wiring board is forcibly subjected to a load for pressing the bumps onto the electrodes. In the present methods according to the above-indicated first through third aspects of the invention, the load (F) and the temperature (T) can be determined to be respective suitable values depending upon the height of the bumps formed on the terminal portions, so that a suitable amount of the conductive solder can be melted on the electrodes.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIGS. 5A and 5B are views for explaining a step of connecting the terminal portions of the FPC and external electrodes of the actuator unit, in which FIG. 5A shows a state before connection of the terminal portions and the external electrodes and FIG. 5B shows a state after connection of the terminal portions and the external electrodes;

FIGS. 6A–6C are views each for explaining a bonding state between the terminal portions and the external electrodes where a load and a temperature are determined to be held within respective suitable ranges depending upon a height of bumps, in which FIG. 6A is a case where the height of the bumps belongs to a height range of 30–50 μm, FIG. 6B is a case where the height of the bumps belongs to a height range of 50–70 μm, and FIG. 6C is a case where the height of the bumps belongs to a height range of 70–100 μm;

FIGS. 7A–7C are views each for explaining a bonding state between the terminal portions and the external electrodes according to a modified embodiment where only a temperature is determined to be held within a suitable range depending upon a height of bumps, in which FIG. 7A is a case where the height of the bumps belongs to a height range of 30–50 μm, FIG. 7B is a case where the height of the bumps belongs to a height range of 50–70 μm, and FIG. 7C is a case where the height of the bumps belongs to a height range of 70–100 μm; and FIGS. 8A–8C are views each for explaining a bonding state between the terminal portions and the external electrodes according to another modified embodiment where only a load is determined to be held within a suitable range depending upon a height of bumps, in which FIG. 8A is a case where the height of the bumps belongs to a height range of 30–50 μm, FIG. 8B is a case where the height of the bumps belongs to a height range of 50–70 μm, and FIG. 8C is a case where the height of the bumps belongs to a height range of 70–100 μm.

DETAILED DESCRIPTION OF THE PREFERRED EMBODIMENTS

Figure 1:
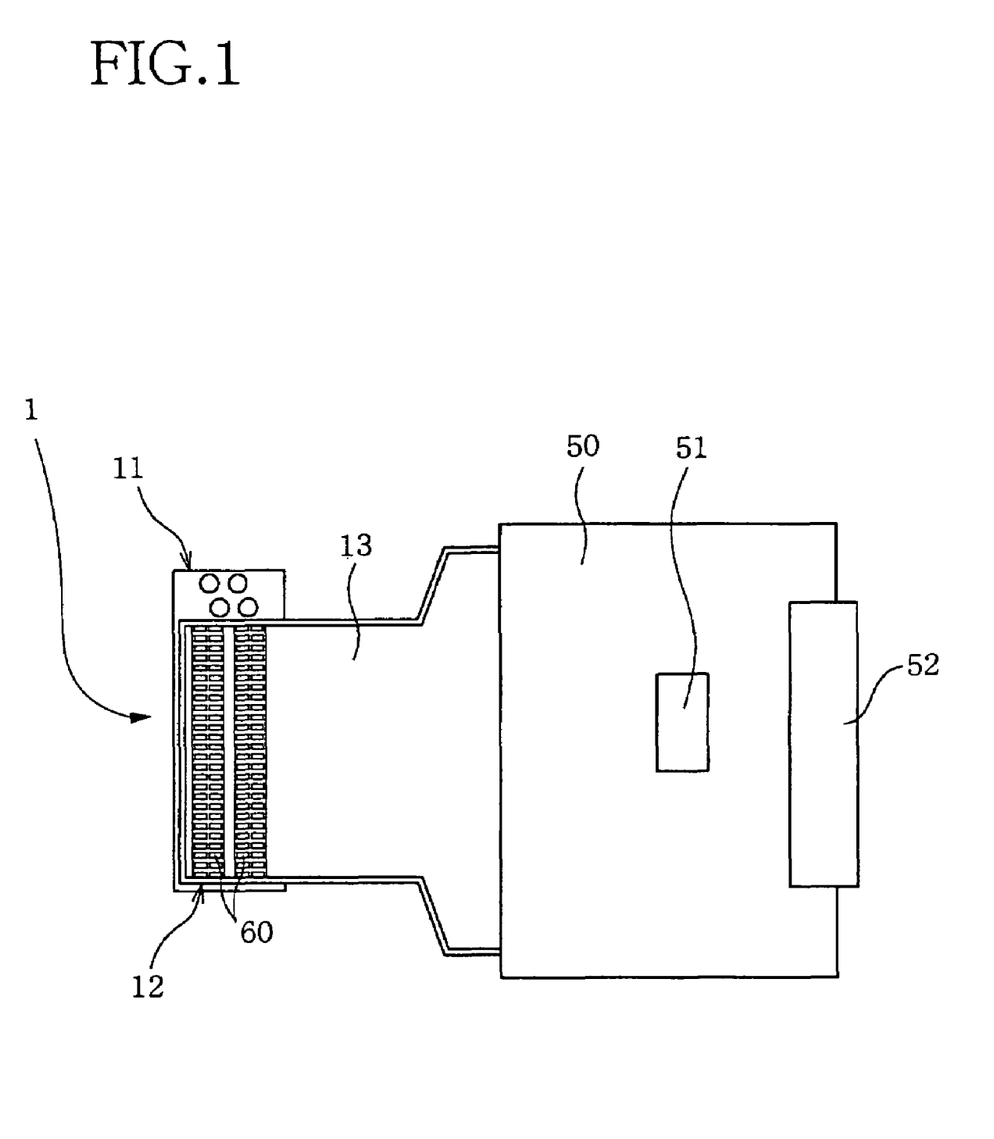
FIG. 1 is a plan view of an ink-jet head in a state in which a FPC is connected to the ink-jet head according to the invention.
Figure 2:
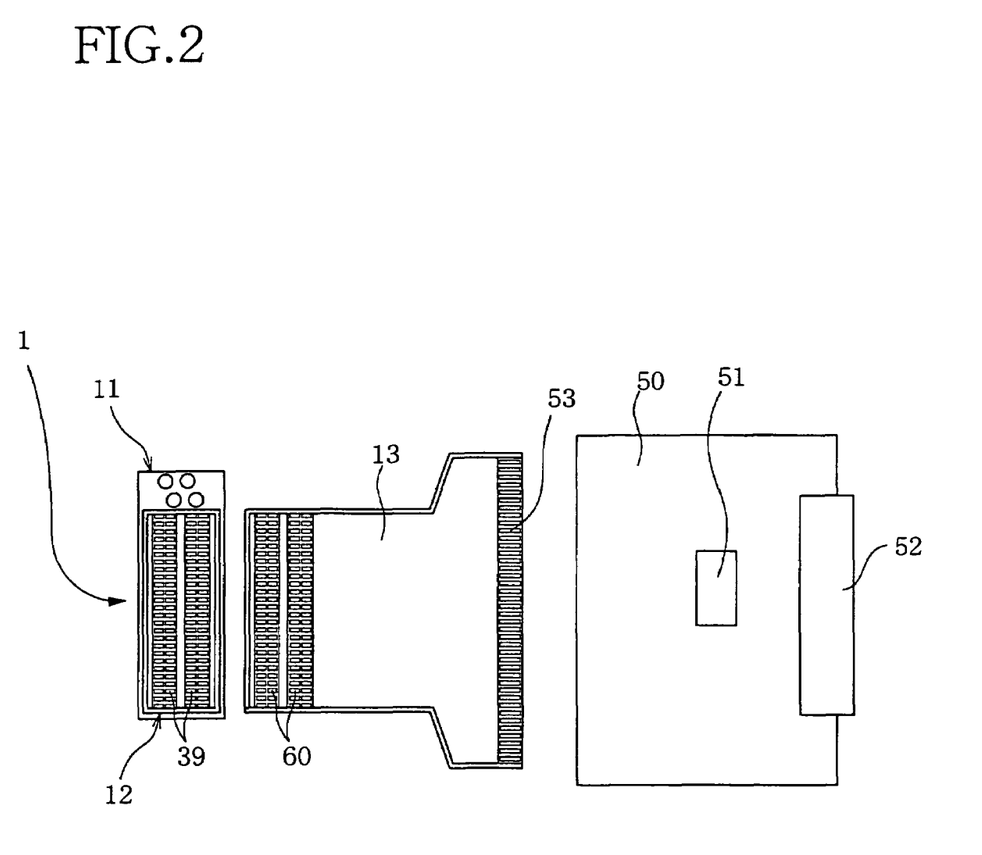
FIG. 2 is a plan view of the ink-jet head in a state in which a FPC is not connected to the ink-jet head.
Figure 3:
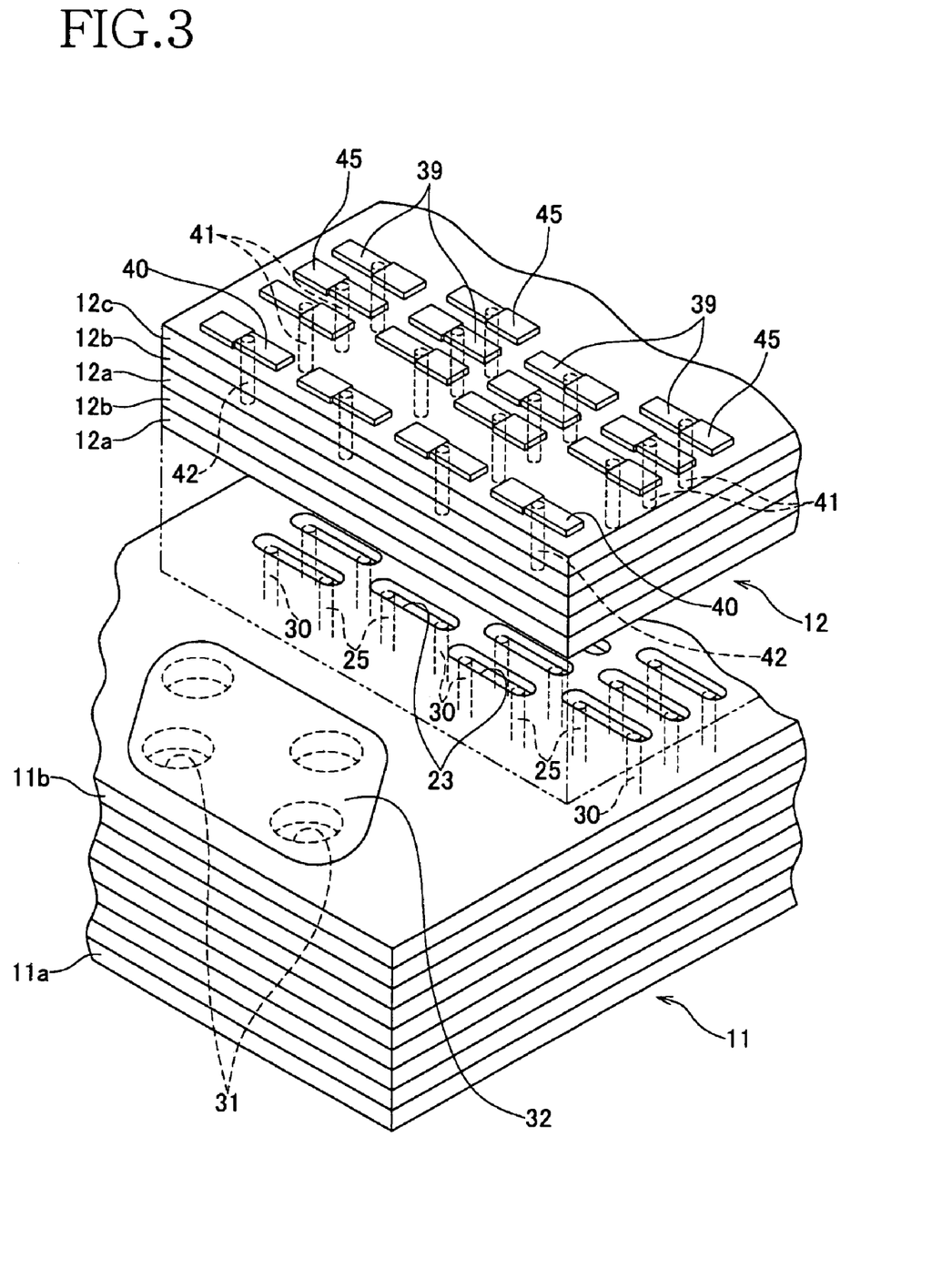
FIG. 3 is a partially enlarged perspective view showing a flow-path unit and an actuator unit.

There will be described one embodiment of the present invention referring to the drawings. In this embodiment, the principle of the invention is applied to an ink-jet head as a recording head arranged to eject ink from nozzles toward a recording medium. As shown in FIGS. 1–3, the ink-jet generally indicated at 1 in FIGS. 1 and 2 includes a flow-path unit 11 having a rectangular shape in plan view and an actuator unit 12 provided on the flow-path unit 11. The actuator unit 12 is connected to a driver circuit board 50 on which is mounted a driver IC 51, via a flexible printed wiring board 13 as a wiring member. (For the reason explained in "Discussion of the Related Art", the flexible printed wiring board 13 is hereinafter referred to as "FPC 13".) The driver circuit board 50 is connected to a control device (not shown) of an ink-jet printer via a connector 52.

As shown in FIG. 3, the flow-path unit 11 has a laminar structure consisting of nine plates each of which has a rectangular shape in plan view and which are stacked on one another. Among these nine plates, a nozzle plate 11a which is a lowermost layer is formed with a plurality of nozzles (not shown). The plurality of nozzles are arranged in four rows extending in a longitudinal direction of the nozzle plate 11a such that the nozzles in two rows as a pair are arranged in zigzag fashion. In a cavity plate 11b which is an uppermost layer, a plurality of pressure chambers 23 which respectively correspond to the plurality of nozzles are formed in four rows extending in a longitudinal direction of the cavity plate 11b such that the pressure chambers in two rows as a pair are arranged in zigzag fashion.

In seven plates interposed between the cavity plate 11b and the nozzle plate 11a, there are formed four manifolds (not shown) extending in the longitudinal direction to correspond to the four rows of the pressure chambers 23, ink passages 30 for connecting the manifolds and the pressure chambers 23, and ink passages 25 for connecting the pressure chambers 23 and the nozzles. In the flow-path unit 11, there are formed, for the respective pressure chambers 23, individual ink paths extending from the manifolds to the nozzles via the pressure chambers 23. Thus, there are formed recording elements each of which is constituted by including the individual ink path, the nozzle, etc. The four manifolds are connected to an ink cartridge (not shown) via four ink supply holes 31 formed at one longitudinal end of the cavity plate 11b. A filter 32 is provided to cover the four ink supply holes 31 for filtering foreign matter contained in ink.

The actuator unit 12 has a laminar structure including: two piezoelectric sheets 12a and two piezoelectric sheets 12b, each of the sheets 12a and each of the sheets 12b being alternately stacked on each other; and a piezoelectric sheet 12c stacked on the uppermost sheet 12b. On each piezoelectric sheet 12a, there are formed a plurality of individual electrodes (not shown) which respectively correspond to the plurality of pressure chambers 23. On each piezoelectric sheet 12b, there is formed a common electrode (not shown) to cover the entire surface of the sheet 12b except for portions thereof in the vicinity of through-holes 41. On the piezoelectric sheet 12c, there are formed a plurality of surface electrodes 39, 40. The piezoelectric sheets 12a, 12b, 12c are formed of a ceramic material of lead zirconate titanate (PZT) having ferroelectricity and have a rectangular shape in plan view identical to each other. The plurality of surface electrodes 39 are respectively connected to the plurality of individual electrodes via the respective through-holes 41 and are located at positions overlapping the corresponding pressure chambers 23 in plan view. In other words, as shown in FIG. 3, like the pressure chambers 23, the surface electrodes 39 are formed on the piezoelectric sheet 12c in four rows such that the surface electrodes 39 in two rows as a pair are arranged in zigzag fashion. Each of the surface electrodes 39, 40 is made of an Ag—Pd based metal material and has a strip-like shape extending in a widthwise direction of the piezoelectric sheet 12c. While not shown, the individual electrodes that are connected to the corresponding surface electrodes 39 via the corresponding through-holes 41 have, in plan view, a shape similar to that of the surface electrodes 39 and are located at positions overlapping the corresponding surface electrodes 39 (and the corresponding pressure chambers 23) in plan view. The common electrodes are connected to the surface electrodes 40 via through-holes 42 and are grounded via the FPC 13 (which will be explained) that is connected to the surface electrodes 40 so as to be kept at ground potential.

There will be next explained an operation of the actuator unit 12. The piezoelectric sheets 12a, 12b are arranged to be polarized in the thickness direction thereof. When an electric field is generated, in the polarization direction, in the piezoelectric sheets 12a, 12b sandwiched between the individual electrodes and the common electrodes by setting any one of the surface electrodes 39 connected to the corresponding individual electrodes to have an electric potential different from that of the surface electrodes 40 connected to the common electrodes, portions of the piezoelectric sheets 12a, 12b in which the electric field is generated function as active portions and are likely to elongate or contract in the thickness direction, i.e., in a direction of stacking of the piezoelectric sheets.

In the thus arranged actuator unit 12, when an ejection pulse signal is applied to any one of surface electrodes 39 from the driver IC 51 (FIGS. 1 and 2) via the FPC 13, the electric potential of the individual electrodes connected to the signal-supplied surface electrode 39 becomes a predetermined positive or negative electric potential which permits the direction of the electric field and the direction of the polarization to be the same to each other, so that the piezoelectric sheets 12a, 12b interposed between the individual electrodes and the common electrodes are likely to contract. Since, as shown in FIG. 3, the lowermost piezoelectric sheet 12a is fixed at its lower surface to the upper surface of the cavity plate 11b defining the pressure chambers 23, the piezoelectric sheets 12a–12c deform into a convex shape that protrudes toward one of opposite sides of the ink-jet head 1 remote from the pressure chambers 23 toward the upper side as seen in FIG. 3. As a result, the volume of the pressure chamber 23 corresponding to the signal-supplied surface electrode 39 is increased and the pressure of the ink in the pressure chamber 23 is accordingly decreased, so that the ink is sucked into the pressure chamber 23 from the manifold. Thereafter, when the electric potential of the individual electrodes returns to the electric potential equal to that of the common electrodes, the ink sucked into the pressure chamber 23 from the manifold is pushed into the corresponding nozzle, whereby the ink is ejected from the nozzle.

Next, there will be explained a structure of connection between the actuator unit 12 and the FPC 13.

Figure 4:
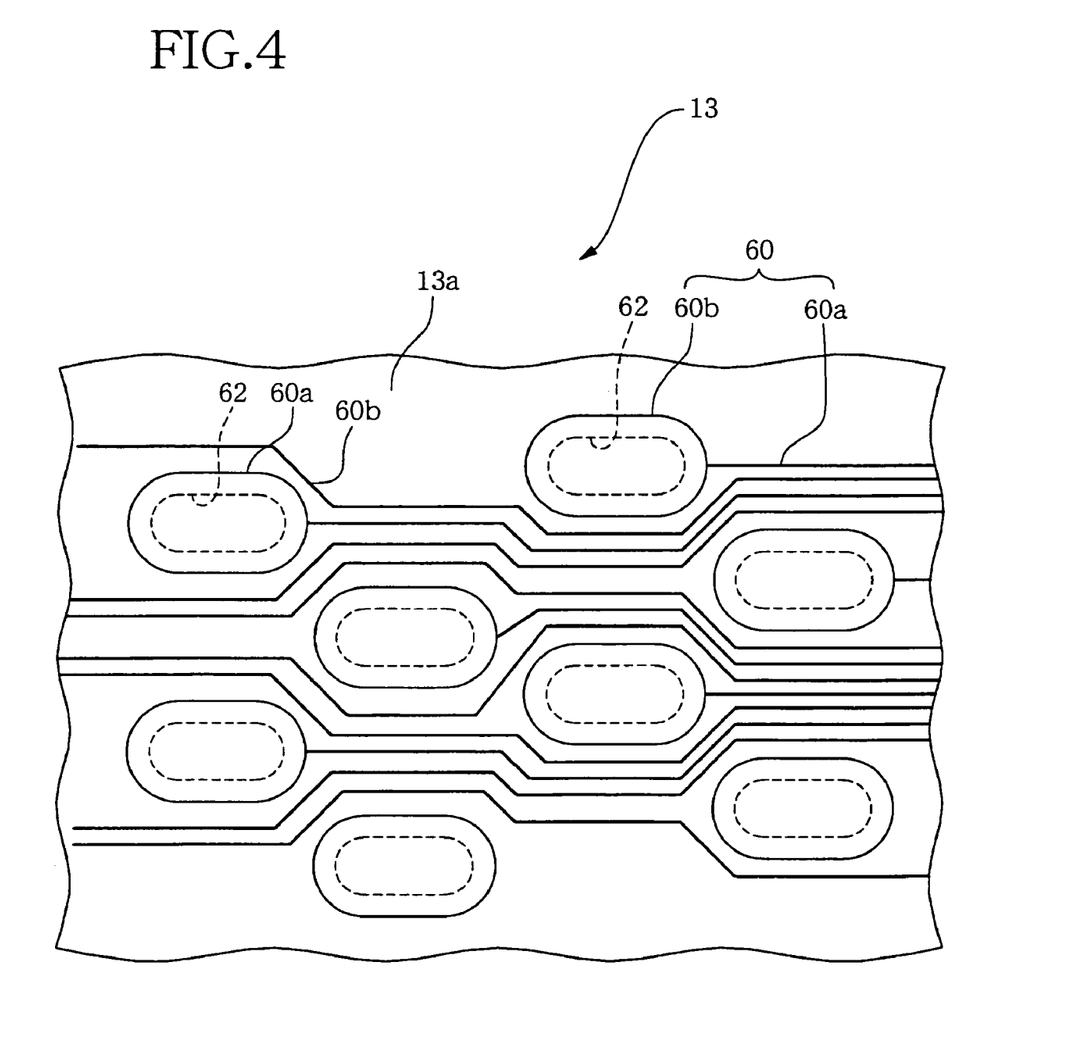
FIG. 4 is a partially enlarged plan view showing conductive leads each including a wire portion and a terminal portion.
Figure 5A:
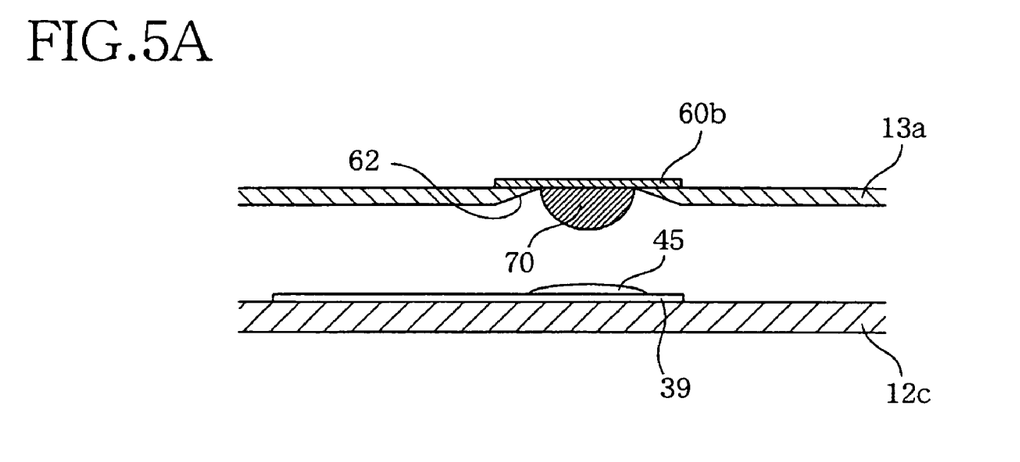
Figure 5B:
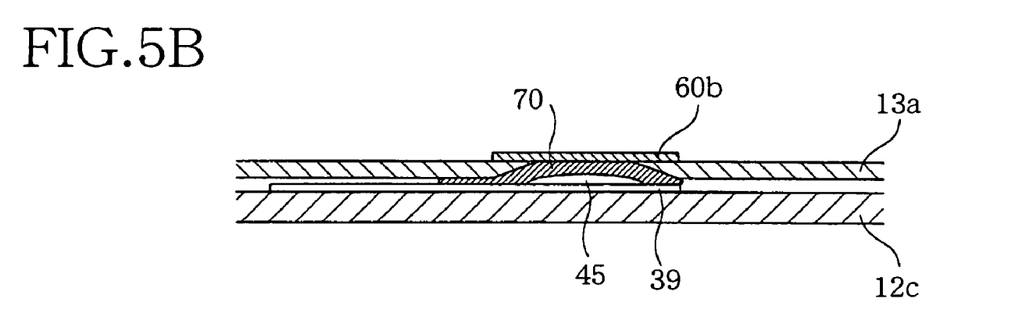

As shown in FIGS. 3, 5A and 5B, an external electrode 45 is formed on each of the surface electrodes 39 which are provided on the uppermost piezoelectric sheet 12c. To the external electrodes 45, there are respectively connected terminal portions 60b (FIG. 4) of the FPC 13 as explained below. Each external electrode 45 is made of a metal material such as Ag and has a generally rectangular shape in plan view. Each external electrode 45 has a width larger than that of the surface electrodes 39 and a length smaller than that of the same 39. As shown in FIG. 3, the external electrodes 45 are formed on opposite end portions of the surface electrodes 39 arranged in one row, so as to be arranged in zigzag fashion.

As shown in FIGS. 4, 5A, and 5B, the FPC 13 includes: a base member 13a formed of a polyimide film; and a plurality of conductive leads 60 which are formed on one surface of the base member 13a (i.e., the upper surface of the base member 13a as seen in FIG. 5) by using copper foil and each of which has a wire portion 60a and the terminal portion 60b that is connected to one end of the corresponding wire portion 60a. The terminal portions 60b of the conductive leads 60 are located at positions corresponding to the respective external electrodes 45 of the actuator unit 12. Each of the wire portions 60a connected to the corresponding terminal portion 60b is located on the base member 13a so as to extend between adjacent other terminal portions 60b while avoiding the adjacent other terminal portions 60b. The conductive leads 60 constitute a wiring pattern for individually connecting the driver IC 51 (FIGS. 1 and 2) and the external electrodes 45 to one another. As shown in FIGS. 1 and 2, a terminal portion 53 is provided on another end of each wire portion 60a so as to be connected to the driver circuit substrate 50.

As shown in FIGS. 4, 5A, and 5B, through-holes 62 are formed by various working such as laser working, plasma etching, and electrolytic etching, from the lower surface side of the base member 13a that is opposite to the upper surface of the base member 13a on which the terminal portions 60b are provided. The terminal portions 60b are exposed to the underside of the base member 13a through the through-holes 62. As shown in FIG. 4, the through-holes 62 has a size somewhat smaller than that of each terminal portion 60b in plan view. Further, an area of the exposed portion of each terminal portions 60b is smaller than an area of each external electrode 45. The exposed portions of the terminal portions 60b are connected to the corresponding external electrodes 45 by solder, whereby the FPC 13 and the external electrodes 45 of the actuator unit 12 are electrically connected to one another, as shown in FIG. 5B.

Next, there will be explained a method of connecting the FPC 13 to the actuator unit 12.

As shown in FIG. 5A, the through-holes 62 are formed in the base member 13a by laser working or the like, so as to permit the terminal portions 60b to be partially exposed to the underside of the base material 13a. Then, the lower surface of the base member 13a is covered with a masking member except the exposed portions of the terminal portions 60b. In this state, a solder paste including a conductive solder is printed on the lower surface, so that the solder paste is attached to the exposed portions of the terminal portions 60b. Thereafter, the solder paste is once softened at a temperature higher than a melting point of the solder included in the solder paste, whereby the solder paste is spread on the exposed portions of the terminal portions 60b to cover the entirety of the exposed portions. Subsequently, the solder is solidified by cooling, thereby forming convex bumps 70 on the terminal portions 60b (the first step).

Then, the FPC 13 is superposed on the actuator unit 12 with the FPC 13 positioned relative to the actuator unit 12 such that the terminal portions 60b of the FPC 13 are opposed to the respective external electrodes 45 of the actuator unit 12. With the bumps 70 of the FPC 13 pressed onto the respective external electrodes 45 of the actuator unit 12 with a predetermined load, the FPC 13 is heated by a heater or the like, whereby the bumps 70 are heated at a suitable temperature. Thus, the bumps 70 are melted (the second step). The thus molten bumps 70 are spread on the surfaces of the respective external electrodes 45, as shown in FIG. 5B, so that the terminal portions 60b and the external electrodes 45 are connected respectively to one another via the molten bumps 70. The solder which flows outward beyond each external electrode 45 is likely to flow along the surface of the corresponding surface electrode 39 having good wettability owing to the metal material that constitutes the surface electrodes 39. Therefore, the molten solder is allowed to flow on the surface electrodes 39, whereby the molten solder is inhibited from adhering to the piezoelectric sheet 12c. Thus, at the time of ink ejection by the ink-jet head 1, the deformation of the piezoelectric sheet 12c is prevented from being disturbed by the solder which would otherwise adhere to the piezoelectric sheet 12c.

In a case where the FPC 13 having flexibility is pressed onto the external electrodes 45, it is difficult to press the bumps 70 uniformly onto the respective external electrodes 45 by the self-weight of the FPC 13, unlike in a case where a printed wiring board without flexibility is pressed onto external electrodes by its self-weight. Accordingly, in the second step, the FPC 13 is forcibly subjected to a load for pressing the bumps 70 onto the respective external electrodes 45.

In the first step described above, the bumps 70 made of the conductive solder are formed to have a predetermined target height (e.g., 60 µm). However, the actual height of the formed bumps 70 may vary from one FPC 13 to another FPC 13, due to, for instance, error in the accuracy with which the bumps 70 are formed. For instance, the amount of the solder attached to the exposed portion of each terminal portion 60b may vary from one FPC 13 to another FPC 13, due to various factors such as a deterioration of the masking member used in forming the bumps 70 by printing, and a change in the viscosity of the solder paste, which change may be accompanied with a change in temperature at the time of attaching the solder paste to the terminal portions 60b. If the bonding operation is carried out with the load to be applied to the bumps 70 for pressing the bumps 70 onto the external electrodes 45 and the temperature at which the bumps 70 are heated being kept at respective constant values corresponding to the predetermined target height of the bumps 70, in spite of the fact that the height of the bumps 70 varies from FPC to FPC, the amount of the molten solder which flows on the external electrodes 45 and the surface electrodes 39 undesirably varies depending upon the height of the bumps 70. Therefore, in some instances, the reliability in the electrical connection between the terminal portions 60*b* of the FPC 13 and the external electrodes 45 may be deteriorated.

In the light of the above, in the method of connecting the FPC 13 according to the present embodiment, it is obtained to which height range the height of the actually formed bumps 70 belongs among predetermined three divided height ranges, and a load F and a temperature T to be employed in the bonding operation are determined to be respective suitable values corresponding to the height range to which the height of the bumps 70 belongs, and the bonding operation for bonding the terminal portions 60*b* and the external electrodes 45 respectively to one another is performed. More specifically explained, where the target height of the bumps 70 is 60 µm, the following three height ranges are set in advance, i.e., a first height range of 30–50 µm, a second height range of 50–70 µm, and a third height range of 70–100 µm. In a case where the height of the actually formed bumps 70 deviates from the target height of 60 µm, it is obtained to which height range the height of the actually formed bumps 70 belongs among those three height ranges, and there are selected a suitable load F and a suitable temperature T so as to correspond to the height range to which the actual height of the bumps 70 belongs. The levels of the three height ranges, i.e., the height levels of the three height ranges become higher in order from the first height range to the third height range.

Figure 6A:
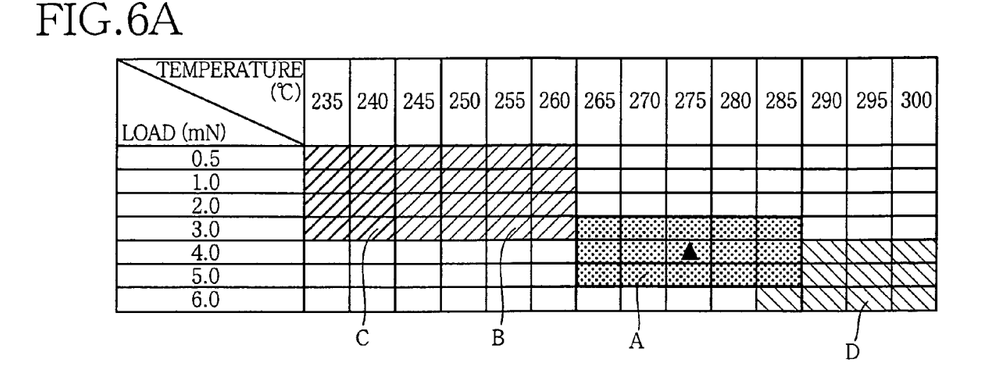
Figure 6B:
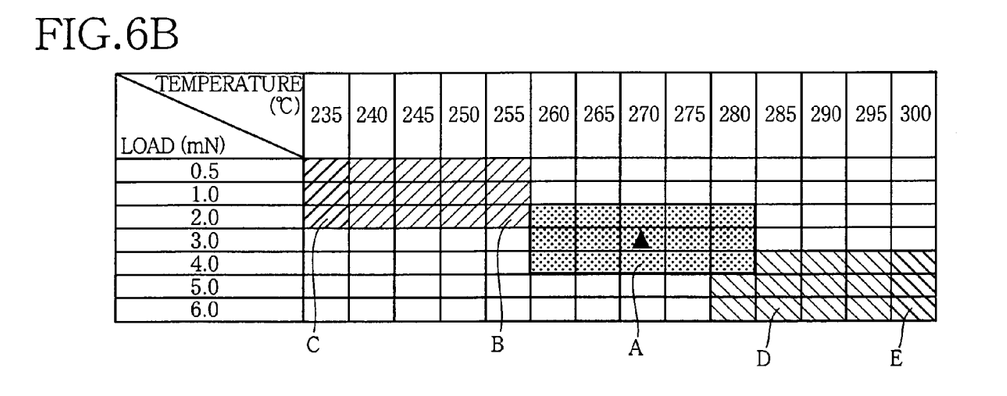
Figure 6C:
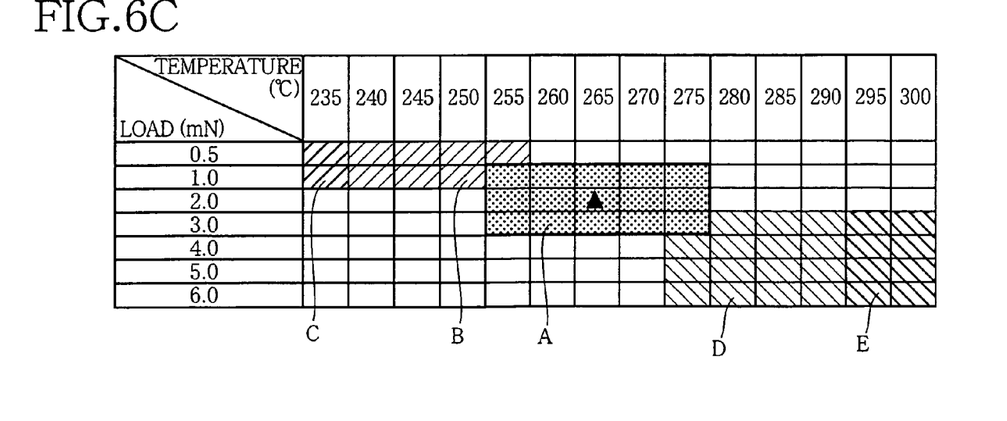

FIGS. 6A–6C are views each showing a bonding state between the terminal portions 60*b* and the external electrodes 45 where the load F and the temperature T are determined to be suitable values (a point indicated by "▲") corresponding to each of the three height ranges described above. FIG. 6A shows the bonding state where the height of the bumps 70 belongs to the first height range of 30–50 µm, FIG. 6B shows the bonding state where the height of the bumps 70 belongs to the second height range of 50–70 µm, and FIG. 6C shows the bonding state where the height of the bumps 70 belongs to the third height range of 70–100 µm. The load value indicated in each of FIGS. 6A–6C corresponds to a load value to be applied to one of the plurality of bumps 70.

In each of FIGS. 6A–6C, in a region A including the point indicated by "▲" (the region A being enclosed with a bold-line rectangular frame), the electrical continuity or conduction between the respective terminal portions 60*b* and the respective external portions 45 is assured and the amount of the molten solder flowing on the external electrodes 45 and the surface electrodes 39 is suitable so as to assure a sufficient degree of bonding strength between the terminal portions 60*b* and the external portions 45. On the other hand, in a region B located on the left side of the region A, the electrical continuity between the terminal portions 60*b* and the external electrodes 45 are assured whereas the bonding strength therebetween is insufficient since the amount of the molten metal flowing on the external electrodes 45 and the surface electrodes 39 is small. Further, in a region C located on the left side of the region B, the terminal portions 60*b* are not bonded to the external portions 45 and the electrical connection therebetween is poor.

Further, in a region D located on the right side of the region A, the electrical continuity between the terminal portions 60*b* and the external portions 45 is assured whereas the amount of the molten metal flowing on the external electrodes 45 and the surface electrodes 39 is excessively large. Accordingly, in the region D, the amount of the solder that contributes for assuring appropriate bonding strength between the terminal portions 60*b* and the external electrodes 45 is small, so that the bonding strength is insufficient. In a region E located on the right side of the region D, a plurality of the terminal portions 60*b* which are adjacent to one another suffer from an electrical short due to the molten solder, and therefore the electrical connection is poor.

As shown in FIG. 6A, where the height of the bumps 70 belongs to the first height range of 30–50 µm, the terminal portions 60*b* and the external electrodes 45 are respectively bonded to one another via the respective bumps 70 by setting the load F and the temperature T such that a load to be applied to one of the bumps 70 is 4 mN and the temperature is 275° C. (the point indicated by "▲" in FIG. 6A). In some instances, the terminal portions 60*b* and the external electrodes 45 may be respectively bonded to one another under a load and a temperature which somewhat deviate from the determined load and the determined temperature, depending upon a degree of accuracy of the operation of a bonding apparatus to be used. Even in such instances, it is possible to assure a good bonding state between the terminal portions 60*b* and the external electrodes 45, as long as the load F and the temperature T fall within the region A (i.e., as long as the load F falls within a range of 3–5 mN and the temperature T falls within a range of 265–285° C.). Accordingly, it is not required to use, in performing the bonding operation, a highly accurate bonding apparatus that assures a high degree of accuracy of the operation.

As shown in FIG. 6B, where the height of the bumps 70 belongs to the second height range of 50–70 µm, the bonding operation is carried out by setting the load F and the temperature T such that a load to be applied to one of the bumps 70 is 3 mN and the temperature is 270° C. However, the load F and the temperature T that actually employed in the bonding operation may fall within the region A of FIG. 6B, in other words, the load F may fall within a range of 2–4 mN and the temperature T may fall within a range of 260–280° C. Similarly, as shown in FIG. 6C, where the height of the bumps 70 belongs to the third height range of 70–100 µm, the bonding operation is carried out by setting the load F and the temperature T such that a load to be applied to one of the bumps 70 is 2 mN and the temperature is 265° C. However, the load F and the temperature T that are actually employed in the bonding operation may fall within the region A of FIG. 6C, in other words, the load F may fall within a range of 1–3 mN and the temperature T may fall within a range of 255–275° C.

The setting values of the load F and the temperature T (the points indicated by "▲") in the respective three height ranges (i.e., the first height range of 30–50 µm, the second height range of 50–70 µm, and the third height range of 70–100 µm) decrease with an increase in the height of the bumps 70, in other words, with an increase in the amount of the solder. Accordingly, where the amount of the solder provided on the terminal portion 60*b* to give each bump 70 is small, the load F and the temperature T are increased so as to prevent the flow amount of the solder from being excessively small. On the other hand, where the amount of the solder provided on the terminal portion 60*b* to give each bump 70 is large, the load F and the temperature T are decreased so as to prevent the solder from flowing to an excessive extent.

Each of the setting values of the load F (mN) and the temperature T (°C.), i.e., each of the points indicated by "▲", in the respective three height ranges shown in FIGS. 6A–6C is obtained according to the following relational expression and the load F and the temperature T is in one-to-one relationship:

$$F=0.2T-51$$

Accordingly, even where a range of the height of the bumps 70 from 30 μm to 100 μm is divided otherwise, i.e., divided into a plurality of height ranges other than the above-indicated three height ranges (i.e., the first height range of 30–50 μm, the second height range of 50–70 μm, and the third height range of 70–100 μm), one of the load F and the temperature T is initially determined and then the other of the load F and the temperature T is obtained according to the above-indicated relational expression. Thus, it is possible to easily determine a load and a temperature that enable good bonding between the terminal portions 60 and the external electrodes 45.

In the method of connecting the FPC 13 described above, the load F and the temperature T are decreased with an increase in a level of the height range to which the height of the bumps 70 formed on the terminal portions 60b belongs. According to the method, where the height of the bumps 70 is small, in other words, where the amount of the solder is small, the load and the temperature are increased to prevent the flow amount of the solder from becoming excessively small. On the other hand, where the height of the bumps 70 is large, in other words, where the amount of the solder is large, the load and the temperature are decreased to prevent the solder from excessively flowing. Therefore, even where the height of the bumps 70 varies from one FPC 13 to another FPC 13, a suitable amount of the solder can be melted on the external electrodes 45 by determining the load F and the temperature T to be respective appropriate values depending upon the height of the bumps 70, i.e., the amount of the solder. Accordingly, the reliability in the electrical connection between the terminal portions 60b and the external electrodes 45 can be improved while increasing the bonding strength therebetween.

There will be next described modified embodiments of the present invention. It is noted that the same reference numerals as used in the illustrated embodiment are used to identify the corresponding components, and a detailed explanation of which is dispensed with.

In the illustrated embodiment, the plurality of divided height ranges to any of which the height of the bumps 70 belongs consists of the three height ranges. The plurality of divided height ranges may consist of two ranges, or four or more ranges. With an increase in the number of the plurality of divided height ranges, the size of the region A in FIGS. 6A–6C is increased. In this case, the required accuracy of the operation of the bonding apparatus can be lowered. Further, the load F and the temperature T may be continuously decreased with an increase in the height of the bumps 70.

On the contrary, where the bonding operation is carried out using a highly accurate bonding apparatus that assures a high degree of accuracy of the operation, good bonding can be attained even if the size of the region A is relatively small. Therefore, each of the plurality of divided height ranges can be made wide, thereby eliminating a need of frequently changing the load F and the temperature T even where the height of the formed bumps somewhat deviates from the target value.

In the illustrated embodiment, in a case where the actual height of the bumps 70 which have been formed to be equal to a predetermined target height deviates from the target height, the load F and the temperature T are determined to fall within respective suitable ranges corresponding to the height range to which the actual height of the bumps belongs. Alternatively, in the step of forming the bumps (i.e., in the first step), one height range may be selected from among a plurality of divided ranges, and the bumps 70 may be formed such that the height of the bumps 70 falls within the selected height range. For instance, the bumps 70 may be formed in the first step such that the height of the bumps 70 falls within one of the three height ranges, i.e., the first height range of 30–50 μm, the second height range of 50–70 μm, and the third height range of 70–100 μm, and the load and the temperature may be determined to fall within respective suitable ranges (the region A in FIGS. 6A–6C) which correspond to the selected height range to which the height of the bumps 70 belongs. According to this arrangement, it is possible to determine appropriate load and temperature conditions for the bumps 70 with the intended height.

In the method of connecting the FPC 13 according to the illustrated embodiment, both of the load F and the temperature T are determined to be respective suitable values which are held in respective ranges corresponding to the height range to which the height of the bumps 70 belongs. Instead one of the load F and the temperature T may be constantly held within a predetermined range irrespective of the height of the bumps 70 whereas the other of the load F and the temperature T may be determined to be held within a suitable range corresponding to the height range to which the height of the bumps 70 belongs, as explained below.

Figure 7A:
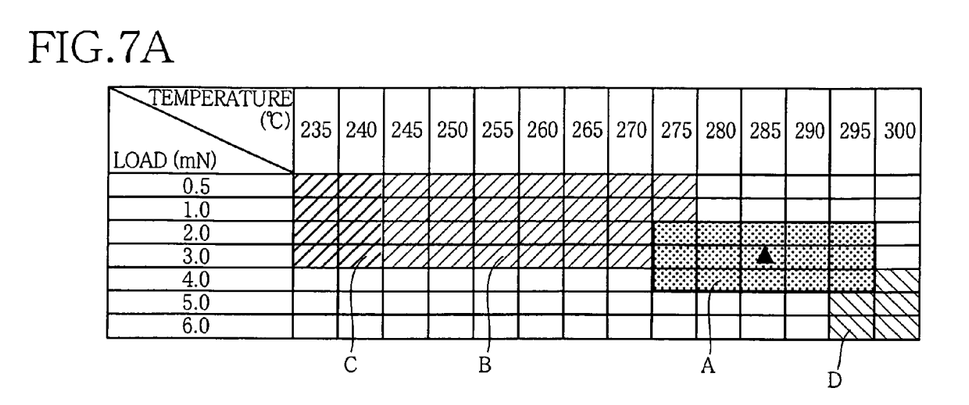
Figure 7B:
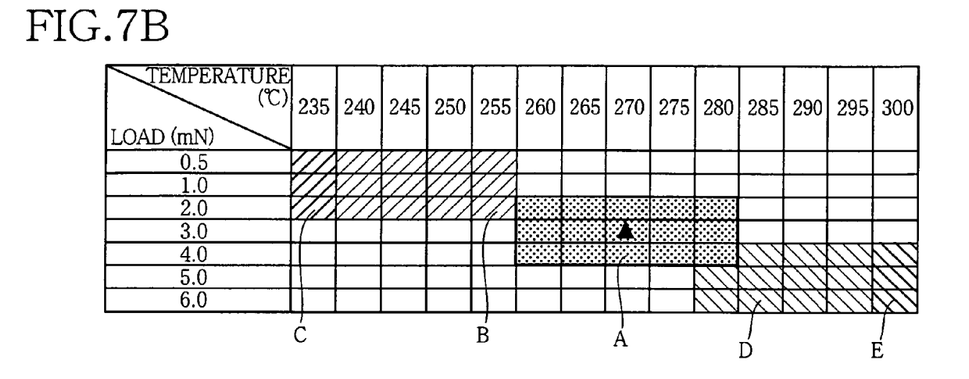
Figure 7C:
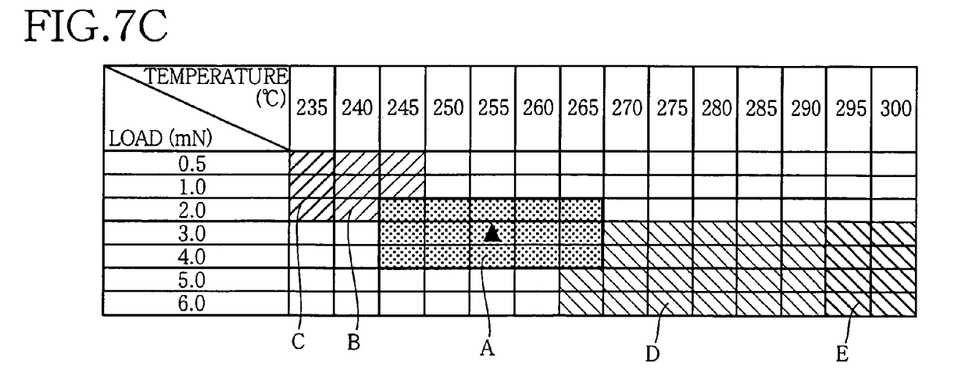

There will be first explained a case in which the load F is constantly held in a predetermined range regardless of the height of the bumps 70 while the temperature T is determined to be held in a suitable range corresponding to the height range to which the height of the bumps 70 belongs. FIGS. 7A–7C are views each showing the bonding state between the terminal portions 60b and the external electrodes 45 where the load F is constantly held in a predetermined range (2–4 mN) over the range of the height of the bumps from 30 μm to 100 μm and the temperature T is determined to be held in a suitable range corresponding to the height range to which the height of the bumps 70 belongs. FIG. 7A shows the bonding state where the height of the bumps 70 is in a first height range of 30–50 μm, FIG. 7B shows the bonding state where the height of the bumps 70 is in a second height range of 50–70 μm, and FIG. 7C shows the bonding state where the height of the bumps 70 is in a third height range of 70–100 μm. As in FIGS. 6A–6C explained above, in the region A, the electrical connection between the terminal portions 60b and the external electrodes 45 is assured and the bonding strength therebetween is sufficient. In the regions B and D, the electrical connection between the terminal portions 60b and the external electrodes 45 is assured whereas the bonding strength therebetween is insufficient. In the regions C and E, the electrical connection is poor.

Where the height of the bumps 70 is in the first height range of 30–50 μm, the temperature T is determined to be relatively high as shown in FIG. 7A, promoting a natural flow of the solder by melting. Namely, the terminal portions 60b and the external electrodes 45 are respectively bonded to one another via the respective bumps 70 by setting the load F such that a load to be applied to one of the bumps 70 is equal to 3 mN and setting the temperature at 285° C. (namely, by setting the load and the temperature at values indicated by a point shown by "▲" in FIG. 7A). In this instance, even if the actual load F and temperature T may deviate from the setting values due to various factors such as error in accuracy with which the bonding apparatus is operated, good bonding can be attained, as long as the actual load and temperature fall within the range A (namely, as long as the actual load and temperature fall within respective ranges of 2–4 mN and a range of 275–295° C.). Further, where the height of the bumps 70 is in the second height range of 50–70 μm, the bonding operation is performed under the load F which is determined such that the load to be applied to one of the bumps 70 is 3 mN and the temperature T which is determined to be 270° C., as shown in FIG. 7B. In this instance, as long as the actual load F and temperature T fall within the region A (namely, as long as the actual load and temperature fall within respective ranges of 2–4 mN and 260–280° C., good bonding can be attained. Similarly, where the height of the bumps 70 is in the third height range of 70–100 μm, the temperature T is determined to be relatively low as shown in FIG. 7C, restraining a natural flow of the solder by melting. Namely, the bonding operation is performed under the load F which is determined such that a load to be applied to one of the bumps 70 is equal to 3 mN and the temperature T which is determined to be 255° C. In this instance, good bonding can be attained, as longs as the actual load F and temperature T fall within the region A (namely, as long as the actual load and temperature fall within respective ranges of 2–4 mN and 245–265° C.)

Figure 8A:
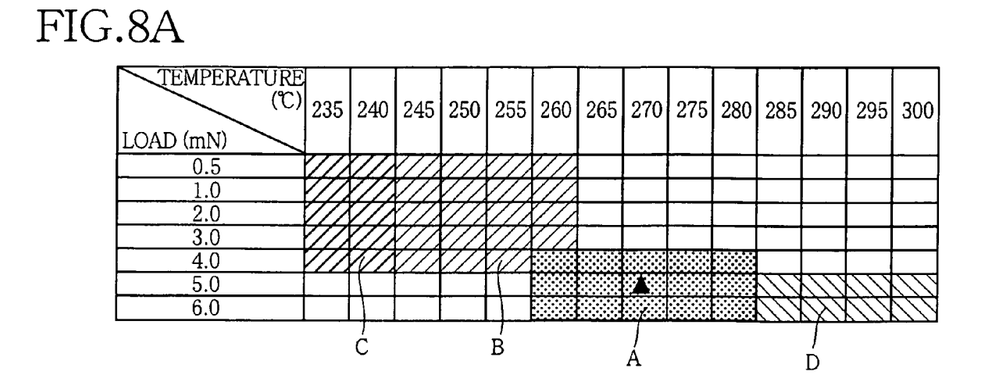
Figure 8B:
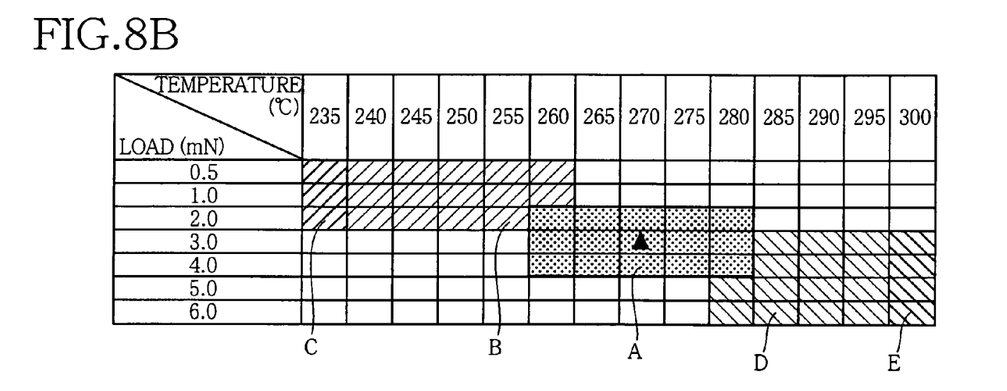
Figure 8C:
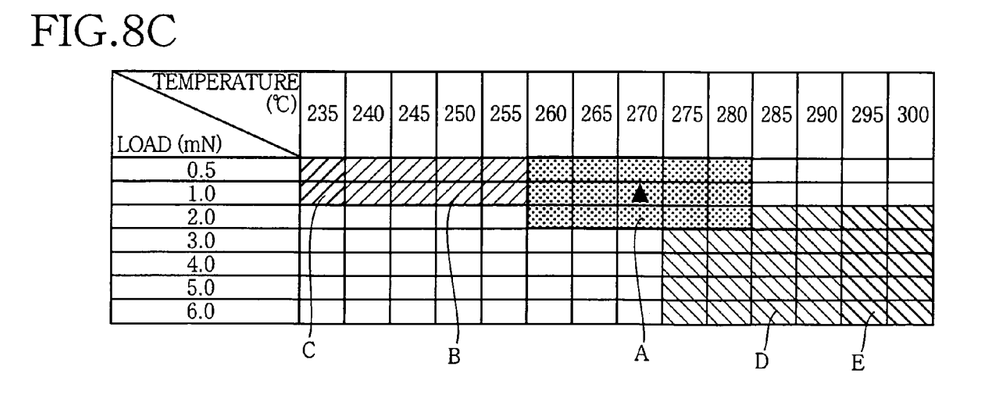

There will be next explained a case in which the temperature T is constantly held in a predetermined range regardless of the height of the bumps 70 while the load F is determined to be held in a suitable range corresponding to the height range to which the height of the bumps 70 belongs. FIGS. 8A–8C are views each showing the bonding state between the terminal portions 60b and the external electrodes 45 where the temperature T is constantly held in a predetermined range (260–280° C.) over the range of the height of the bumps from 30 μm to 100 μm and the load F is determined to be held in a suitable range corresponding to the height range to which the height of the bumps 70 belongs.

Where the height of the bumps 70 is in the first height range of 30–50 μm, the load F is determined to be relatively high as shown in FIG. 8A, promoting spread of the solder. Namely, the terminal portions 60b and the external electrodes 45 are respectively bonded to one another via the respective bumps 70 by setting the temperature T at 270° C. and the load F such that a load to be applied to one of the bumps 70 is equal to 5 mN. In this instance, good bonding can be attained, as long as the actual temperature T and load F fall within the range A (namely, the actual temperature and load fall within respective ranges of 260–280° C. and 4–6 mN). Further, where the height of the bumps 70 is in the second height range of 50–70 μm, the terminal portions 60b and the external electrodes 45 are respectively bonded to one another via the respective bumps 70 under the temperature T which is determined to be 270° C. and the load F which is determined such that the load to be applied to one of the bumps 70 is 3 mN and, as shown in FIG. 8B. In this instance, as long as the actual temperature T and load F fall within the region A (namely, the actual temperature and load fall within respective ranges of 260–280° C. and 2–4 mN), good bonding can be attained. Similarly, where the height of the bumps 70 is in the third height range of 70–100 μm, the load F is determined to be relatively low as shown in FIG. 8C, restraining spread of the solder. Namely, the terminal portions 60b and the external electrodes 45 are respectively bonded to one another via the respective bumps 70 by setting the temperature T at 270° C. and the load F such that a load to be applied to one of the bumps 70 is equal to 1 mN. In this instance, good bonding can be attained, as longs as the actual temperature T and load F fall within the region A (namely, the actual temperature and load fall within respective ranges of 260–280° C. and 0.5–2 mN).

It is to be understood that the connecting method according to the present invention is not limited to the case in which the wiring member having flexibility such as the FPC is connected to the actuator unit, but can be applied to a case in which a wiring member without flexibility such as a printed wiring board is connected to the actuator unit.

It is further understood that the principle of the present invention is applicable to recording heads such as those used for a thermal printer, a dot printer, and the like, other than the ink-jet head.

It is to be understood that the present invention may be embodied with various changes and modifications, which may occur to those skilled in the art, without departing from the spirit and scope of the invention.

What is claimed is:

1. A method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method comprising:
   forming convex bumps by using a conductive solder, respectively on the plurality of terminal portions; and
   connecting the plurality of terminal portions and the plurality of electrodes respectively to one another via the respective convex bumps by heating and melting the convex bumps at a predetermined temperature with the convex bumps pressed respectively onto the plurality of electrodes with a predetermined load,
   wherein the connecting the plurality of terminal portions and the plurality of electrodes is carried out such that the predetermined load and the predetermined temperature are decreased with an increase in a height of the convex bumps.

2. The method according to claim 1, wherein the wiring member has flexibility.

3. A method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method comprising:
   forming convex bumps by using a conductive solder, respectively on the plurality of terminal portions; and
   connecting the plurality of terminal portions and the plurality of electrodes respectively to one another via the respective convex bumps by heating and melting the convex bumps at a predetermined temperature with the convex bumps pressed respectively onto the plurality of electrodes with a predetermined load,
   wherein the connecting the plurality of terminal portions and the plurality of electrodes is carried out such that the predetermined load and the predetermined temperature are decreased with an increase in a level of a height range to which a height of the convex bumps belongs, the height range being one of a plurality of divided height ranges.

4. The method according to claim 3, wherein the wiring member has flexibility.

5. The method according to claim 3, wherein the predetermined load is determined such that a load to be applied to one of the convex bumps is held within a range of 3–5 mN and the predetermined temperature is determined to be held within a range of 265–285° C., where the height of the convex bumps belongs to a height range of 30–50 μm.

6. The method according to claim 5, wherein the predetermined load is determined such that the load to be applied to one of the convex bumps is 4 mN and the predetermined temperature is determined to be 275° C.

7. The method according to claim 3, wherein the predetermined load is determined such that a load to be applied to one of the convex bumps is held within a range of 2–4 mN and the predetermined temperature is determined to be held within a range of 260–280° C., where the height of the convex bumps belongs to a height range of 50–70 μm.

8. The method according to claim 7, wherein the predetermined load is determined such that the load to be applied to one of the convex bumps is 3 mN and the predetermined temperature is determined to be 270° C.

9. The method according to claim 3, wherein the predetermined load is determined such that a load to be applied to one of the convex bumps is held within a range of 1–3 mN and the predetermined temperature is determined to be held within a range of 255–275° C., where the height of the convex bumps belongs to a height range of 70–100 μm.

10. The method according to claim 9, wherein the predetermined load is determined such that the load to be applied to one of the convex bumps is 2 mN and the predetermined temperature is determined to be 265° C.

11. A method of electrically connecting a wiring member to a plurality of electrodes which respectively correspond to a plurality of recording elements of a recording head, the wiring member including a plurality of wire portions and a plurality of terminal portions each of which is connected to the corresponding wire portion, the method comprising:
forming convex bumps by using a conductive solder, respectively on the plurality of terminal portions; and
connecting the plurality of terminal portions and the plurality of electrodes respectively to one another via the respective convex bumps by heating and melting the convex bumps at a predetermined temperature with the convex bumps pressed respectively onto the plurality of electrodes with a predetermined load,
wherein the connecting the plurality of terminal portions and the plurality of electrodes is carried out such that one of the predetermined load and the predetermined temperature is decreased with an increase in a level of a height range to which a height of the convex bumps belongs, the height range being one of a plurality of divided height ranges.

12. The method according to claim 11, wherein the wiring member has flexibility.

13. The method according to claim 11, wherein the predetermined temperature is decreased with an increase in the level of the height range to which the height of the convex bumps belongs, the height range being one of the plurality of divided height ranges.

14. The method according to claim 13, wherein where the height of the convex bumps is in a range of 30–100 μm and the predetermined load is determined such that a load to be applied to one of the convex bumps is held within a range of 2–4 mN, the predetermined temperature is decreased with an increase in the level of the height range to which the height of the convex bumps belongs, the height range being one of the plurality of divided height ranges.

15. The method according to claim 14, wherein the predetermined temperature is determined to be held within a range of 275–295° C. where the height of the convex bumps belongs to a height range of 30–50 μm.

16. The method according to claim 15, wherein the predetermined load is determined such that the load to be applied to one of the convex bumps is 3 mN and the predetermined temperature is determined to be 285° C.

17. The method according to claim 14, wherein the predetermined temperature is determined to be held within a range of 260–280° C. where the height of the convex bumps belongs to a height range of 50–70 μm.

18. The method according to claim 17, wherein the predetermined load is determined such that the load to be applied to one of the convex bumps is 3 mN and the predetermined temperature is determined to be 270° C.

19. The method according to claim 14, wherein the predetermined temperature is determined to be held within a range of 245–265 ° C. where the height of the convex bumps belongs to a height range of 70–100 μm.

20. The method according to claim 19, wherein the predetermined load is determined such that the load to be applied to one of the convex bumps is 3 mN and the predetermined temperature is determined to be 255° C.

21. The method according to claim 11, wherein the predetermined load is decreased with an increase in the level of the height range to which the height of the convex bumps belongs, the height range being one of the plurality of divided height ranges.

22. The method according to claim 21, wherein where the height of the convex bumps is in a range of 30–100 μm and the predetermined temperature is determined to be held within a range of 260–280° C., the predetermined load is decreased with an increase in the level of the height range to which the height of the convex bumps belongs, the height range being one of the plurality of divided height ranges.

23. The method according to claim 22, wherein the predetermined load is determined such that a load to be applied to one of the convex bumps is held within a range of 4–6 mN where the height of the convex bumps belongs to a height range of 30–50 μm.

24. The method according to claim 23, wherein the predetermined temperature is determined to be 270° C. and the predetermined load is determined such that the load to be applied to one of the convex bumps is 5 mN.

25. The method according to claim 22, wherein the predetermined load is determined such that a load to be applied to one of the convex bumps is held within a range of 2–4 mN where the height of the convex bumps belongs to a height range of 50–70 μm.

26. The method according to claim 25, wherein the predetermined temperature is determined to be 270° C. and the predetermined load is determined such that the load to be applied to one of the convex bumps is 3 mN.

27. The method according to claim 22, wherein the predetermined load is determined such that a load to be applied to one of the convex bumps is held within a range of 0.5–2 mN where the height of the convex bumps belongs to a height range of 70–100 μm.

28. The method according to claim 27, wherein the predetermined temperature is determined to be 270° C. and the predetermined load is determined such that the load to be applied to one of the convex bumps is 1 mN.

* * * * *